US008269348B2

(12) United States Patent
Fazelpour

(10) Patent No.: US 8,269,348 B2
(45) Date of Patent: Sep. 18, 2012

(54) IC DIE INCLUDING RDL CAPTURE PADS WITH NOTCH HAVING BONDING CONNECTORS OR ITS UBM PAD OVER THE NOTCH

(75) Inventor: Siamak Fazelpour, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 214 days.

(21) Appl. No.: 12/872,006

(22) Filed: Aug. 31, 2010

(65) Prior Publication Data

US 2011/0204515 A1 Aug. 25, 2011

Related U.S. Application Data

(60) Provisional application No. 61/306,837, filed on Feb. 22, 2010.

(51) Int. Cl.
H01L 23/498 (2006.01)
H01L 21/768 (2006.01)
(52) U.S. Cl. ........... 257/738; 257/E23.069; 257/E21.59; 257/E23.141; 257/E23.02; 257/E23.017; 257/737; 257/778; 257/691; 257/692; 257/734; 438/612
(58) Field of Classification Search .................. 257/738, 257/737, 734, 784, 786, 778, 774, 775, 690, 257/691, 692, 693, E23.069, E21.59, E23.141, 257/E23.02, E23.017, E23.021; 438/612; 716/11
See application file for complete search history.

(56) References Cited

U.S. PATENT DOCUMENTS

| 7,786,582 | B2 * | 8/2010 | Thomas et al. ............... 257/758 |
| 8,035,226 | B1 * | 10/2011 | Wilcoxen et al. ............. 257/738 |
| 8,120,181 | B2 * | 2/2012 | Lin et al. ....................... 257/758 |
| 2001/0011764 | A1 * | 8/2001 | Elenius et al. ................. 257/679 |
| 2004/0238957 | A1 * | 12/2004 | Akram et al. ................. 257/738 |
| 2007/0152693 | A1 * | 7/2007 | Yang et al. .................... 324/763 |
| 2007/0200239 | A1 * | 8/2007 | Su ................................. 257/738 |
| 2008/0081457 | A1 * | 4/2008 | Lin et al. ....................... 438/614 |
| 2008/0150161 | A1 * | 6/2008 | Lin et al. ....................... 257/778 |
| 2009/0278263 | A1 | 11/2009 | McCarthy et al. |
| 2010/0181642 | A1 * | 7/2010 | Sarfaraz et al. ............... 257/528 |
| 2010/0264516 | A1 * | 10/2010 | Lin et al. ....................... 257/531 |
| 2011/0186986 | A1 * | 8/2011 | Chuang et al. ................ 257/737 |
| 2011/0186995 | A1 * | 8/2011 | Alvarado et al. ............. 257/737 |
| 2011/0202896 | A1 * | 8/2011 | Scanlan et al. ................ 716/119 |
| 2011/0204511 | A1 * | 8/2011 | Beddingfield et al. ........ 257/737 |
| 2012/0032338 | A1 * | 2/2012 | Komori ......................... 257/773 |
| 2012/0061823 | A1 * | 3/2012 | Wu et al. ....................... 257/737 |

* cited by examiner

*Primary Examiner* — A O Williams
(74) *Attorney, Agent, or Firm* — Steven A. Shaw; W. James Brady; Frederick J. Telecky, Jr.

(57) ABSTRACT

An IC die includes active circuitry and I/O nodes tied together in first net and at least a second net. A first die pad and a second die pad adjacent thereto are coupled to the first and second net, respectively. A redirect layer (RDL) coupled to the die pads over a first dielectric vias includes a first RDL trace lateral coupling the first die pad and first RDL pad and a second RDL trace coupling the second die pad and second RDL pad. The first RDL pad includes an RDL notch facing the second RDL trace. Under bump metallization (UBM) pads on a second dielectric include a first UBM pad coupled to the first RDL pad over a second dielectric via. A first metal bonding connector is on the first UBM pad. The first UBM pad or first metal bonding connector overhangs the first RDL pad over the notch.

17 Claims, 4 Drawing Sheets

IC DIE INCLUDING RDL CAPTURE PADS WITH NOTCH HAVING BONDING CONNECTORS OR ITS UBM PAD OVER THE NOTCH

CROSS REFERENCE TO RELATED APPLICATIONS

This application and the subject matter disclosed herein claims the benefit of Provisional Application Ser. No. 61/306,837 entitled "BALL ON PERIPHERAL PAD ROW/COLUMN FOR WCSP APPLICATIONS", filed Feb. 22, 2010, which is herein incorporated by reference in its entirety.

FIELD

Disclosed embodiments relate to integrated circuits (ICs), and more particularly to wafer chip scale packages (WCSP).

BACKGROUND

WCSP eliminates conventional packaging steps such as die bonding, wire bonding, and die level flip chip attach processes to a package substrate by using the IC die itself as the WCSP substrate. Use of the die itself as the WCSP substrate significantly reduces the footprint to the IC die itself as compared to the same IC die attached to a larger footprint package substrate.

WCSP can be embodied as direct-bump WCSP or redirect layer (RDL) WCSP which unlike direct-bump WCSP adds an RDL that functions as a rewiring layer that enables repositioning external terminals at desired positions. In a typical RDL WCSP production flow, after completion of conventional back end of the line (BEOL) wafer fab processing, the IC die generally includes die pads (also known as bond pads or die bond pads) and a passivation layer over the BEOL metal stack except over the die pads. A first WCSP dielectric (e.g., a polyimide) is deposited. Lithography/etch forms first vias in the first WCSP dielectric over the die pads, followed by deposition and patterning of an RDL metal including a plurality of RDL traces which contact the die pads and extends laterally therefrom.

A second WCSP dielectric (e.g., a polyimide) is then deposited and second vias formed that reach the RDL in RDL capture pad positions that are lateral to the position of the die pads. Under bump metallization (UBM) pads commonly referred to as "ball pads" or "bump pads" are formed over the second vias and are coupled to and generally enclosed by RDL capture pads, followed by forming metal (e.g., solder) balls, pillars or other bonding connectors on the UBM pads. The area of the RDL capture pads is generally larger than the area of the UBM pad thereon to absorb stresses and thus improve reliability. The WCSP wafer is then singulated to form a plurality of singulated WCSP die, commonly for use on boards for portable devices where the board area is precious.

Each bonding connector, such as a solder ball, provides a repositioned I/O connection for the WCSP die. Thus, the "ball count" commonly refers to the total number of I/O connections on the WCSP die. The I/O connections are electrically tied together into a plurality of different "nets", such as at least one VDD net, one or more signal nets, and a VSS (ground) net. The balls associated with the respective nets can be tied by one of the metal layers on the die, the RDL, or a combination of both of these arrangements.

The number of balls or other bonding connectors that can be fit on the WCSP die is determined by clearance design rules that define the minimum pitch between the respective balls or other bonding connectors, the "ball to pad" design rule that defines the minimum spacing between bonding connectors and die pads associated with different nets, and the requirement that the UBM pad under the bonding connectors be completely enclosed by the RDL. The first and second of these design rules are intended to prevent leakage or shorts between different nets, with the third requirement for improved reliability.

One solution for increasing the number of balls or other bonding connectors on the WCSP die involves positioning some of the die pads between rows or columns of the bonding connectors. This solution can alleviate the problem of die size growth, but requires a die pad or I/O layout change which necessitates changing one or more die masks.

SUMMARY

Disclosed embodiments describe ICs that alter conventional RDL designs by changing the relative sizes of the UBM pad and its underlying RDL capture by notching the RDL capture pad near an adjacent die pad. With the notched RDL capture pad, the UBM pad and/or the bonding connector (e.g. solder ball) thereon partially overhangs the RDL capture pad. The notching enables metal bonding connector (e.g., ball) to adjacent pad spacings that violate conventional ball to pad clearance design rules, which increases the number of bonding connectors (e.g., balls) fitting on the IC without enlarging the die size or needing to change the layout of the die pads or I/O. Disclosed embodiments can reduce the size of some die (for a fixed number of bonding connectors) by 10% or more.

Disclosed embodiments also address the step in the second dielectric and UBM created due to notching the RDL capture pad by sloping the edges of the notched RDL capture pads. The Inventor has found by sloping the edges of the notched RDL capture pads to an angle between 20 and 70 degrees the step coverage of the second dielectric layer under the UBM step edges is generally excellent and the UBM pad conforms to the smooth slope of the second dielectric layer thereunder.

Disclosed embodiments also include embodiments that restore back the effective rest-ring (i.e. the overlap of the UBM pad relative to its underlying second dielectric via) to avoid adversely affecting reliability, including reducing the via size for the second dielectric or positioning the second dielectric via off-center in the RDL capture pad. As a consequence the reliability of the notched region is excellent.

In a typical embodiment the IC includes a first RDL capture pad coupled to a first die pad associated with a first I/O node (net) that includes a notch (i.e. a cutout) which increases a spacing between the first RDL capture pad and an RDL trace coupled to an adjacent second die pad that is connected to a different net. The notch can cut out the area of overlap between the RDL capture pad and the neighboring die pad. The metal bonding connector (e.g., ball, pillar or stud) and/or its underlying UBM pad partially overhangs the first RDL capture pad by having a portion that overhangs the first RDL capture pad over the notch. In one embodiment the first metal bonding connector and/or its UBM pad overlaps the second die pad.

DETAILED DESCRIPTION

Figure 1:
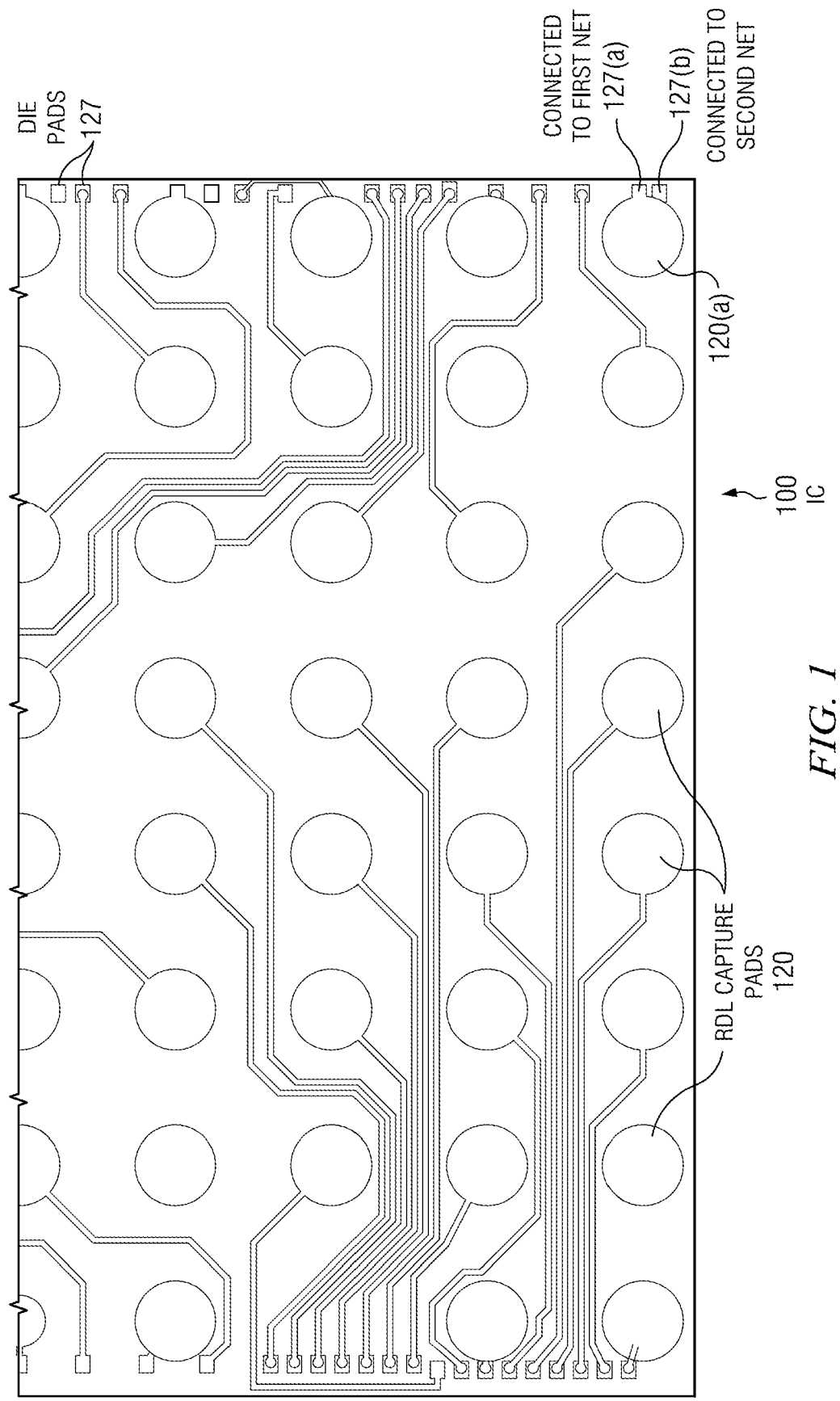
FIG. 1 is a top view depiction of an IC die showing an RDL layout including some periphery RDL capture pads that overlap at least one die pad associated with a different net, according to a disclosed embodiment.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a top view depiction of an IC die 100 showing an RDL layout including RDL capture pads 120, including some periphery RDL capture pads that overlap at least one die pad associated with a different net, according to an embodiment of the invention. Although not shown in FIG. 1, the IC 100 comprises active circuitry configured to provide a circuit function including a plurality of I/O nodes connected to die pads 127 shown as peripheral die pads that are tied together into a first net and at least a second net by one or more metallization layers. UBM pads over the RDL capture pads 120, and metal bonding connectors, such as solder balls, pillars (e.g., copper pillars) or studs (e.g., Au studs), that will be formed over the UBM pads, are not shown in FIG. 1 for simplicity.

Although the die pads 127 shown in FIG. 1 are all periphery die pads, disclosed embodiments are not limited to periphery die pad arrangements, and can include interior die pads, or include both interior die pads and periphery die pads. Particularly for analog and some mixed signal designs, there can sometimes be sufficient freedom to include interior die pads. In such embodiments, notched RDL capture pads as disclosed herein can be positioned in interior die positions adjacent to interior die pads.

In the lower right hand corner of FIG. 1, periphery RDL capture pad 120(a) is shown coupled to die pad 127(a) associated with a first net (e.g., VDD) that can be seen to overlap die pad 127(b) associated with a different (e.g., second) net (e.g., VSS). The overlapping RDL capture pad to die pad arrangement shown in FIG. 1 can eliminate the need for die growth when it is desired to increase the number of balls or other bonding connectors. However, without the notch (or cutout) in the RDL capture pad 120(a) described below, insufficient RDL spacing can lead to problems of shorting (or leakage) between an RDL capture pad associated with one net and an RDL trace associated with a different net.

Figure 2A:
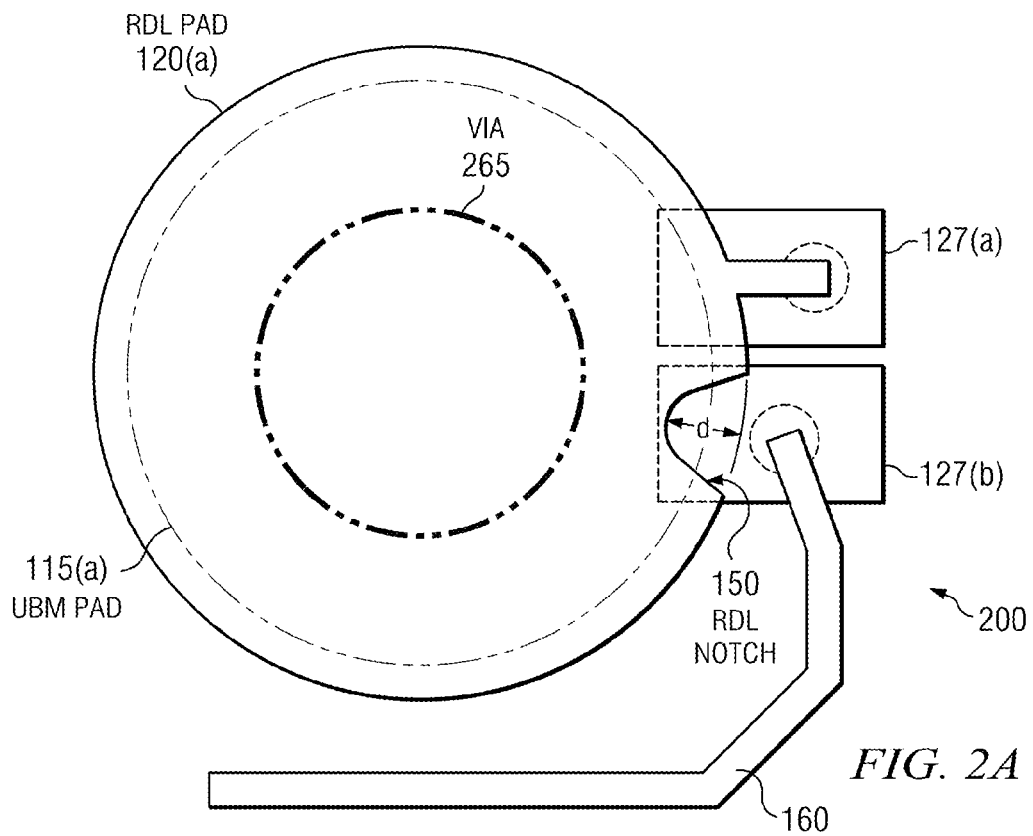
FIG. 2A is a depiction of an RDL pattern portion, showing at least one RDL capture pad that includes a notch which faces a neighboring RDL trace that is over and coupled to a neighboring die pad associated with another net, where the notch increases the spacing between the RDL capture pad and the neighboring RDL trace, according to a disclosed embodiment.

FIG. 2A is a depiction of an RDL pattern portion 200, showing RDL capture pad 120(a) including an RDL notch 150 that faces neighboring RDL trace 160 that is over and coupled to a neighboring die pad 127(b) associated with another net, where the RDL notch 150 increases the spacing between the RDL capture pad and neighboring RDL trace 160 according to a disclosed embodiment. As used herein a "notch" refers to a cutout/recessed region in an otherwise uniform RDL capture pad geometry, such as exemplary uniform capture pad geometries including a circle, rectangle, square, or regular hexagon, where the cutout/recessed region provides a recess distance "d" of at least 2 µm in at least one portion thereof relative to the projected boundary that would exist for an RDL capture pad having a uniform (non-notched) geometry. Although the RDL notch 150 is generally shown herein as semi-circular, notches can have other shapes, such as rectangular or square, and include irregular shapes. The RDL pattern portion 200 is shown including positions for subsequently formed second dielectric via 265 and UBM pad 115(a) over the RDL capture pad 120(a).

Typical embodiments include both notched RDL capture pads and non-notched (conventional) RDL capture pads. Conventional RDL capture pads can be used when the neighboring die pad adjacent to an RDL capture pad are both associated with the same net, or there is no need to approach or violate the ball to pad design rule. For example, FIG. 3A described below shows an IC die including a notched RDL capture pad and a conventional notchless RDL capture pad.

Figure 2B:
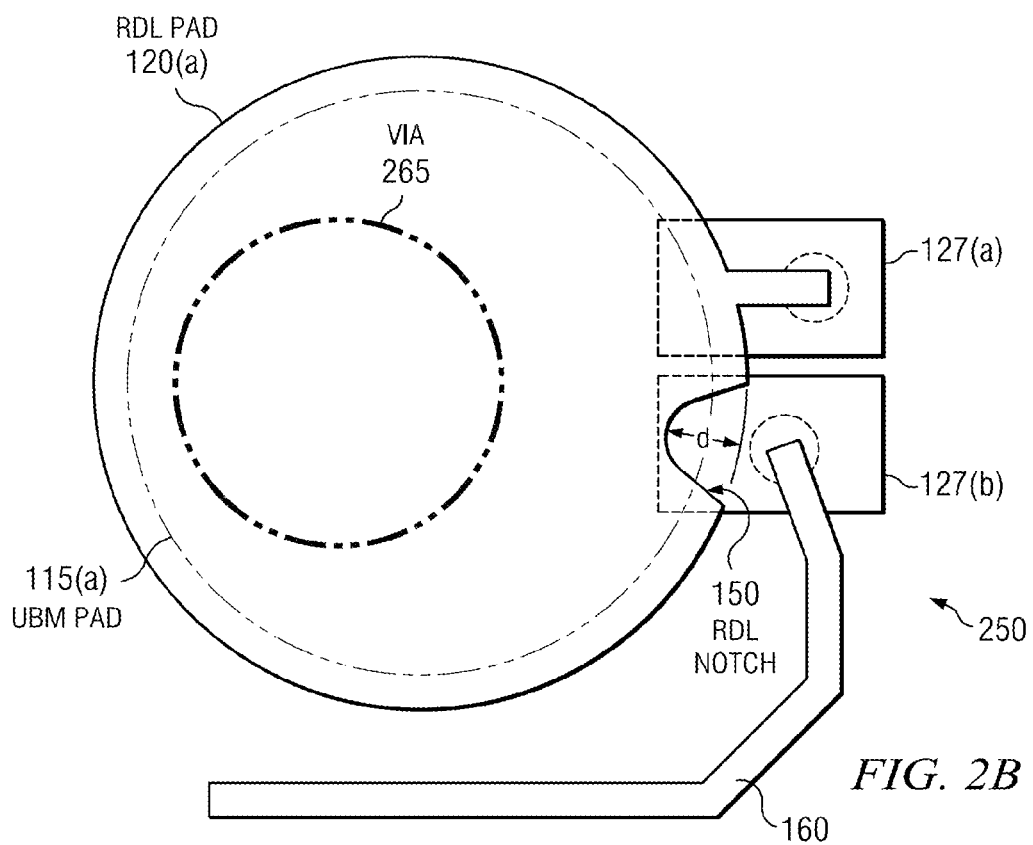
FIG. 2B is a depiction of an RDL pattern portion based on RDL pattern portion shown in FIG. 2A modified to move the position of the subsequently formed second dielectric via off-center from the center of the RDL capture pad to increase the effective rest-ring of the UBM pad, according to a disclosed embodiment.

FIG. 2B is a depiction of an RDL pattern portion 250 based on RDL pattern portion 200 shown in FIG. 2A modified to move the position of the subsequently formed second dielectric via 265 off-center from the center of the notched RDL capture pad 120(a) to increase the effective rest-ring of the UBM pad 115(a), according to a disclosed embodiment. The effective rest ring is defined as the overlap of the UBM pad 115(a) relative to its underlying second dielectric via 265. Restoring the effective rest-ring lost due to the notched RDL capture pad avoids the possible otherwise adversely reliability impact due to the notching. Although not shown, another (non-mutually exclusive) way to restore effective rest-ring is to shrink the size of the second dielectric via 265 for the notched RDL capture pads, such as from 170 μm in diameter to 140 μm diameter in one embodiment. Conventional notchless RDL capture pads on the IC die that have no rest-ring impact will not generally include rest-ring restoration described above.

Figure 3A:
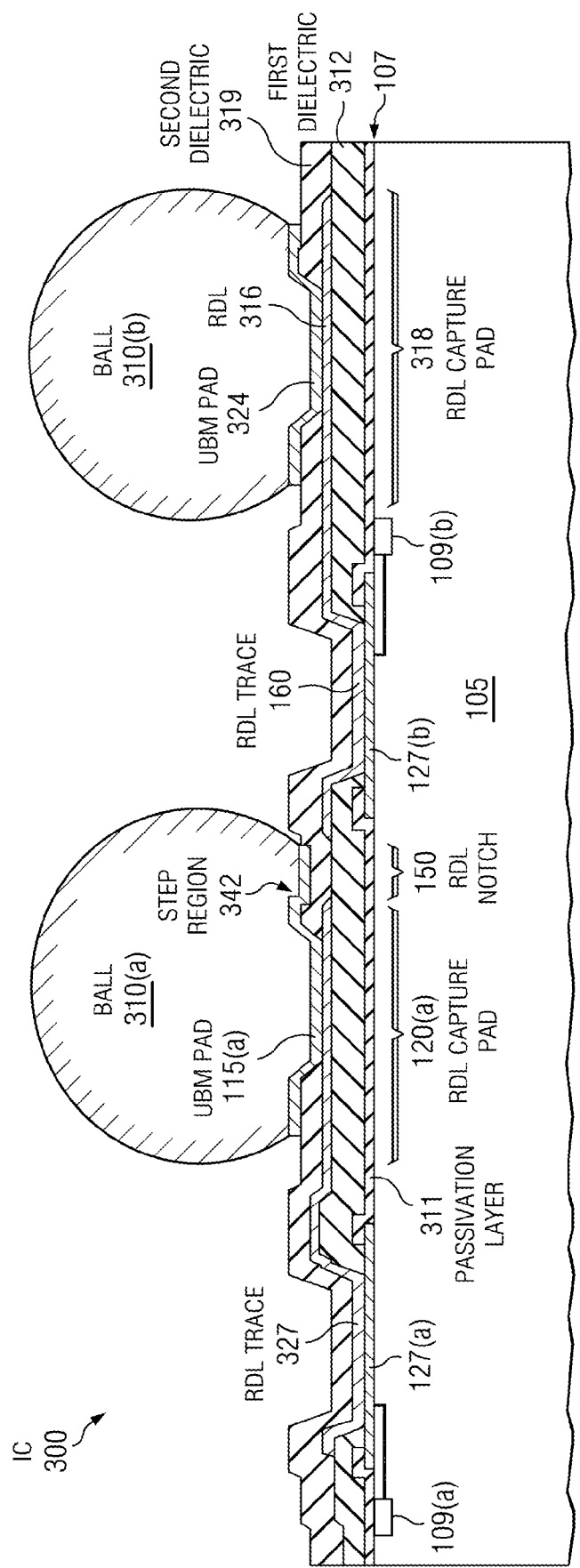
FIG. 3A shows a cross sectional depiction of a portion of an exemplary IC including a RDL capture pad having a notch that faces an RDL trace coupled to a neighboring die pad and a conventional RDL capture pad that is associated with another net, according to a disclosed embodiment.

FIG. 3A shows a cross sectional depiction of a portion of an exemplary IC die 300 including an RDL capture pad 120(a) having an RDL notch 150 that faces a neighboring RDL trace 160 coupled to a neighboring die pad 127(b), and a conventional RDL capture pad 318 that is associated with another net, according to a disclosed embodiment. A metal bonding connector shown as a solder ball 310(a) is on UBM pad 115(a) that is on the notched RDL capture pad 120(a). RDL capture pad 120(a) is coupled by RDL trace 327 to die pad 127(a).

IC die 300 is seen to violate the general requirement that the UBM pad 115(a) under the ball 310(a) be completely enclosed by its RDL capture pad 120(a) since the UBM pad 115(a) and the ball 310(a) on top of UBM pad 115(a) both partially overhang the RDL capture pad 120(a) over the RDL notch 150. IC 300 can also be seen to violate the conventional "ball to pad" design rule that defines the minimum spacing between bonding connectors and die pads associated with different nets (ball 310(a) to die pad 127(b)). UBM pad 324 is over RDL capture pad 318 and has solder ball 310(b) thereon.

IC die 300 comprises a substrate 105 having a top semiconductor surface 107 comprising active circuitry shown as active circuitry 109(a) and 109(b). A node within active circuitry 109(a) is shown coupled to die pad 127(a), and a node within active circuitry 109(b) is shown coupled to die pad 127(b). IC 300 also includes a passivation layer 311 on the top semiconductor surface 107 (typically over the BEOL layers formed on the top semiconductor surface 107), that has apertures that expose die pads 127(a) and 127(b) to allow coupling thereto. A first dielectric layer 312 is over the passivation layer that includes first dielectric vias over die pads 127(a) and 127(b). First dielectric layer 312 can comprise dielectrics such as polyimides or benzocyclobutene (BCB).

RDL 316 is on first dielectric layer 312 and provides RDL trace 327, RDL capture pad 120(a), neighboring RDL trace 160 and RDL capture pad 318. Neighboring RDL trace 160 couples RDL capture pad 318 to die pad 127(b). A second dielectric layer 319 includes second dielectric vias that are over the RDL capture pad 120(a) and RDL capture pad 318. Second dielectric layer 319 can comprise dielectrics such as polyimides or BCB.

Reference 342 in FIG. 3A points to the step region 342 in which there is a step in the UBM pad 115(a) and the second dielectric layer 319 due to the RDL notch 150. The edge of the RDL capture pad 120(a) that defines the RDL notch 150 as described above is generally at an angle of 20 to 70 degrees, with an angle of about 45 degrees shown in FIG. 3A. As noted above, when the edges of the notched RDL capture pads are sloped to an angle between 20 and 70 degrees, the step coverage of the dielectric layer under the UBM edges is excellent and the UBM pad conforms to the smooth slope of the second dielectric layer 319 thereunder.

In one embodiment the sloped edges are angled between 30 and 60 degrees, such as 43 to 47 degrees in one particular embodiment. Conventional etching methods known in the art can be used to obtained sloped RDL edges having a desired angle, such as a slope-etch technique. For example, in the case of copper RDLs, a resist layer can be formed having a desired negative slope or lift-off profile, followed by copper deposition, then resist lift off.

Figure 3B:
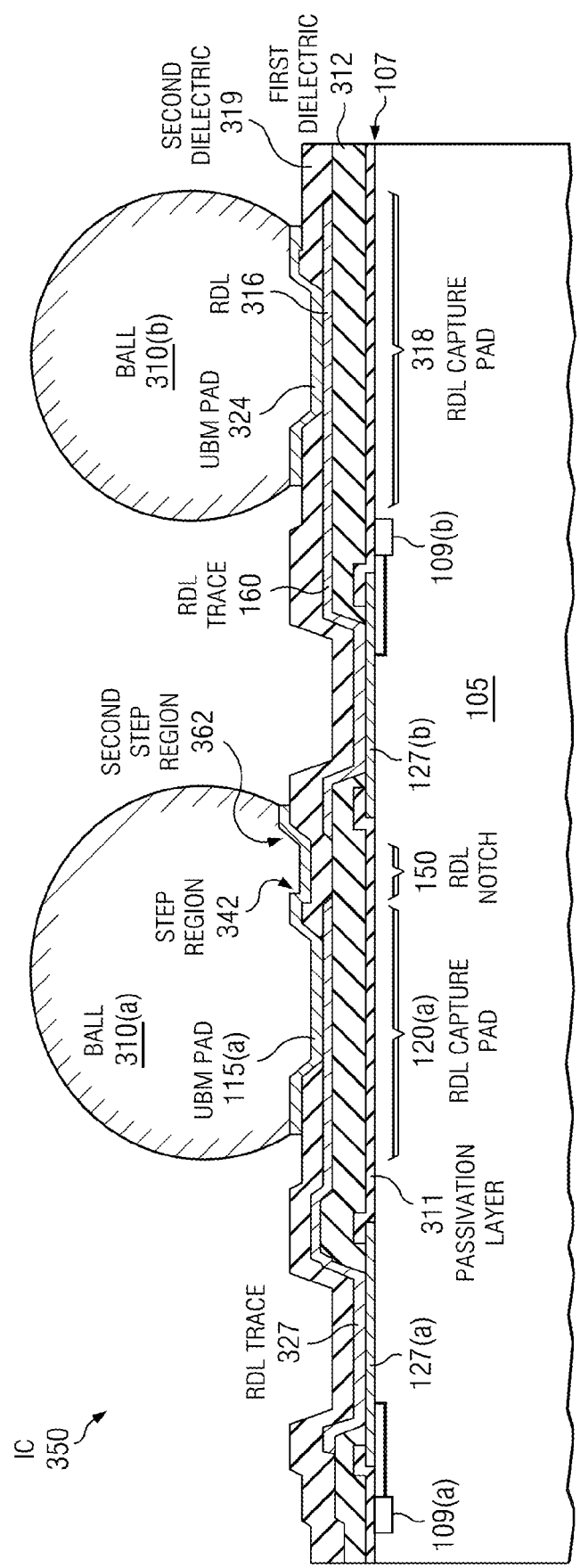
FIG. 3B shows a cross sectional depiction of a portion of an exemplary IC die including a RDL capture pad having a notch that faces an RDL trace coupled to a neighboring die pad including a conventional RDL capture pad that is associated with another net, wherein the bonding connector and its UBM on the notched RDL capture pad overlaps the neighboring die pad, according to a disclosed embodiment.

FIG. 3B shows a cross sectional depiction of a portion of an exemplary IC die 350 including a RDL capture pad 120(a) having an RDL notch 150 that faces a neighboring RDL trace 160 coupled to a neighboring die pad 127(b) including a conventional RDL capture pad 318 that is associated with another net, wherein the bonding connector 310(a) and its UBM pad 115(a) on the notched RDL capture pad 120(a) overlaps the neighboring die pad 127(b), according to a disclosed embodiment. Other than the ball 310(a) and its UBM pad 115(a) overlapping the neighboring die pad 127(b) over the RDL notch 150 of the notched RDL capture pad 120(a) and the resulting second step region 362, IC die 350 is otherwise equivalent to IC die 300 shown in FIG. 3A.

As noted above, disclosed IC designs can increase the number of bonding features (e.g., balls) fitting on an IC die without enlarging the die size or needing to change the layout of the die pads or I/O. Disclosed die designs can also be used to reduce the size of some IC die (for a fixed number of bonding connectors) by 10% or more. There is no need to change the die masks and die layout using disclosed embodiments which saves design time, mask cost and project schedule hit. The die size advantages provided saves cost for both the IC die manufacturer and its customers.

The active circuitry formed on the top semiconductor surface comprises circuit elements that generally include transistors, diodes, capacitors, and resistors, as well as signal lines and other electrical conductors that interconnect these various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

I claim:

1. An integrated circuit (IC) die, comprising:
a substrate comprising active circuitry including a plurality of I/O nodes grouped in a first net and at least a second net, and a plurality of die pads including a first die pad coupled to said first net and a second die pad adjacent to said first die pad coupled to said second net;
a first dielectric layer including first dielectric vias over said plurality of die pads;
a redirect layer (RDL) including a plurality of RDL capture pads coupled to said plurality of die pads over said first dielectric vias, said RDL including a first RDL trace laterally coupling said first die pad to a first RDL capture pad and a second RDL trace laterally coupling said second die pad to a second RDL capture pad, wherein said first RDL capture pad includes a notch that faces said second RDL trace;
a second dielectric layer including second dielectric vias over said plurality of RDL capture pads;
under bump metallization (UBM) pads coupled to said plurality of RDL capture pads over said second dielectric vias including a first UBM pad on said first RDL capture pad, and
metal bonding connectors on said UBM pads including a first metal bonding connector on said first UBM pad,
wherein at least one of said first UBM pad and said first metal bonding connector include a portion that overhangs said first RDL capture pad over said notch.

2. The IC die of claim 1, wherein at least one of said first UBM pad and said first metal bonding connector overlap said second die pad.

3. The IC die of claim 1, wherein said first die pad and said second die pad both are peripheral die pads.

4. The IC die of claim 1, wherein said first RDL capture pad includes sloped edges bordering said notch that are angled between 20 and 70 degrees, and wherein said notch creates steps in said UBM pads and said second dielectric layer is over edges of said notch.

5. The IC die of claim 4, wherein said sloped edges are angled between 30 and 60 degrees.

6. The IC die of claim 1, wherein said second dielectric via coupled to said first RDL capture pad is offset in position at least 2 μm relative to a center of said first RDL capture pad.

7. The IC die of claim 1, wherein said metal bonding connectors comprise solder balls.

8. The IC die of claim 1, wherein said second dielectric via associated with said first RDL capture pad has an area that is reduced in size by at least 10% as compared to said second dielectric vias associated with ones of said plurality of RDL capture pads that do not include said notch.

9. The IC die of claim 1, wherein said first dielectric layer and said second dielectric layer both comprise a polyimide or benzocyclobutene (BCB).

10. A method of forming an integrated circuit (IC) die, comprising:
providing a wafer having a top semiconductor surface including a plurality of IC die, said IC die comprising active circuitry and a plurality of I/O nodes grouped into a first net and at least a second net, and a plurality of die pads including a first die pad coupled to said first net and a second die pad adjacent to said first die pad coupled to said second net, and a first dielectric layer including first dielectric vias over said plurality of die pads;
forming a redirect layer (RDL) including a plurality of RDL capture pads on said first dielectric layer coupled to said plurality of die pads over said plurality of first dielectric vias, said RDL including a first RDL trace laterally coupling said first die pad to a first RDL capture pad and a second RDL trace laterally coupling said second die pad to a second RDL capture pad, wherein said forming includes forming a notch in said first RDL capture pad that faces said second RDL trace for increasing a spacing between said first RDL capture pad and said second RDL trace;
forming a second dielectric layer including second dielectric vias over said plurality of RDL capture pads;
forming under bump metallization (UBM) pads over said second dielectric vias on each of said plurality of RDL capture pads including a first UBM pad on said first RDL capture pad, and
forming metal bonding connectors on said UBM pads including a first metal bonding connector on said first UBM pad,
wherein at least one of said first UBM pad and said first metal bonding connector includes a portion that overhangs said first RDL capture pad over said notch.

11. The method of claim 10, wherein at least one of said first UBM pad and said first metal bonding connector overlaps said second die pad.

12. The method of claim 10, wherein said first die pad and said second die pad both are peripheral die pads.

13. The method of claim 10, wherein said forming said RDL includes forming said first RDL capture pad including sloped edges bordering said notch that are angled between 20 and 70 degrees, and wherein said notch creates steps in said UBM pads and said second dielectric layer over edges of said notch.

14. The method of claim 13, wherein said sloped edges are angled between 30 and 60 degrees.

15. The method of claim 10, wherein said forming said second dielectric vias comprises offsetting a position of said second dielectric via that is coupled to said first RDL capture pad by at least 2 μm relative to a center of said first RDL capture pad.

16. The method of claim 10, wherein said second dielectric via associated with said first RDL capture pad has an area that is reduced in size by at least 10% as compared to said second vias associated with ones of said plurality of RDL capture pads that do not include said notch.

17. The method of claim 10, wherein said first dielectric layer and said second dielectric layer both comprise a polyimide or benzocyclobutene (BCB).

* * * * *